(12) United States Patent
Seibold et al.

(10) Patent No.: US 7,814,386 B2
(45) Date of Patent: Oct. 12, 2010

(54) BUILT IN SELF TEST FOR INPUT/OUTPUT CHARACTERIZATION

(75) Inventors: John Joseph Seibold, Dallas, TX (US); Vinay B. Jayaram, Allen, TX (US); Elie Torbey, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 244 days.

(21) Appl. No.: 12/117,268

(22) Filed: May 8, 2008

(65) Prior Publication Data

US 2009/0113264 A1 Apr. 30, 2009

Related U.S. Application Data

(60) Provisional application No. 60/984,208, filed on Oct. 31, 2007.

(51) Int. Cl.
*G01R 31/28* (2006.01)

(52) U.S. Cl. ................ 714/733; 714/727

(58) Field of Classification Search .............. 716/8; 714/718, 726, 727, 731, 733
See application file for complete search history.

(56) References Cited

U.S. PATENT DOCUMENTS

| | | | |
|---|---|---|---|
| 5,347,520 A | 9/1994 | Simpson et al. | |
| 5,450,415 A | 9/1995 | Kamada | |
| 5,570,375 A | 10/1996 | Tsai et al. | |
| 5,812,562 A | 9/1998 | Baeg | |
| 5,983,379 A | 11/1999 | Warren | |
| 6,266,801 B1 * | 7/2001 | Jin | 716/8 |
| 6,374,380 B1 * | 4/2002 | Sim | 714/727 |
| 6,560,739 B1 | 5/2003 | Chung | |
| 6,578,168 B1 * | 6/2003 | Parulkar et al. | 714/727 |
| 6,760,873 B1 | 7/2004 | Hao et al. | |
| 6,877,121 B1 * | 4/2005 | Srinivasaiah et al. | 714/727 |
| 7,174,492 B1 * | 2/2007 | Chung et al. | 714/727 |
| 7,269,769 B2 | 9/2007 | Whetsel | |
| 7,269,770 B1 * | 9/2007 | Chung et al. | 714/727 |
| 2003/0188243 A1 | 10/2003 | Rajan | |

* cited by examiner

*Primary Examiner*—David Ton
(74) *Attorney, Agent, or Firm*—Dawn V. Stephens; Wade James Brady, III; Frederick J. Telecky, Jr.

(57) ABSTRACT

A test system in an integrated circuit includes at least one boundary scan cell. The boundary scan cell includes a first storage element and a second storage element connected in series with the first storage element. The boundary scan cell also includes test logic configured to provide a test completion signal indicative of completion of a respective test based on a comparison of an output of the first storage element relative to test value (TVALUE). The output of the first storage element is provided to the input of the second storage element unchanged during a first operating state and, depending on the test completion signal, an inverted version of the output of the first storage element can be provided to the input of the second storage element during a second operating state. A bi-directional element is connected to receive the output of the second storage element and to feed the output of the second storage element back to an input of the first storage element.

20 Claims, 7 Drawing Sheets

US 7,814,386 B2

BUILT IN SELF TEST FOR INPUT/OUTPUT CHARACTERIZATION

RELATED APPLICATION

This application claims the benefit of U.S. Provisional Patent Application No. 60/984,208, which was filed on Oct. 31, 2007, and entitled "Built In Self Test Based Low Cost Internal Clock Shaping Solution to IO Characterization Using Boundary Scan," the entire contents of which is incorporated herein by reference.

TECHNICAL FIELD

This invention relates to electronic circuits, and more specifically to a system and method for input/output characterization of an integrated circuit.

BACKGROUND

Many approaches have been developed to test and verify interconnects and functionality of integrated circuits (ICs). Existing testing can utilize circuitry external to an IC for a various types of testing, circuitry internal to the IC, or a combination of internal and external circuitry and test equipment.

For example, ICs can be tested both before and after they are assembled into packages (e.g. dual-in-line packages or DIPs, leadless chip carriers or LCCs, pin grid arrays, quad flat packs, etc.). Before assembly into a package, ICs can be probed by special machines utilizing special probe cards and test vectors which consist of sets of input signals, output signals and bi-directional signals. These test vectors are used to provide information to the probe machine such that the IC can be electrically stimulated and verified. Each vector contains a set of input signals (stimulus) and a set of output signals which are verified by the probe machine after application of the input stimulus for each test vector. Once the preassembled ICs are verified to be functional, they are assembled into a packaged part and retested using similar types of apparatuses, which is now equipped with a package socket instead of a set of die pad probes. The same set of test vectors is utilized to verify post assembly operation.

As a further example, IEEE standard 1149.1 (also known as the Joint Test Action Group (JTAG) Standard) establishes a boundary scan implementation for IC interconnect testing. The JTAG standard is a scan-based architecture disposed on the IC under test as a part of the circuitry. Such an IC includes a scan input (receives serial data at an input pin) and a scan output (receives serial data from the ASIC at an output pin). Integrated circuits have increasingly incorporated the JTAG (Joint Test Action Group) test port to facilitate testing and debug of integrated circuit chips mounted on a board. The JTAG standard can be utilized in verification of both the ASICs and board level interconnect after the IC has been mounted onto a circuit board.

Under normal operating conditions, the boundary scan cells simply let the input/output signals pass through them, into and out of the I/O pins. When the device is placed into a 'Test' mode, however, these boundary scan cells become 'active' to enable the capture or control of the signals propagating into and out of the IC, effectively circumventing the device's normal input and output connections.

SUMMARY

The invention relates to electronic circuits, and more specifically to a system and method for input/output characterization of an integrated circuit.

One aspect of the invention provides a test system in an integrated circuit that includes at least one boundary scan cell. The boundary scan cell can include a first storage element a second storage element connected in series with the first storage element. The boundary scan cell also includes test logic configured to provide a test completion signal indicative of completion of a respective test based on a comparison of an output of the first storage element relative to a test value signal, the test logic further configured to provide the output of the first storage element to the input of the second storage element unchanged during a first operating state and, depending at least in part on the test completion signal, to provide an inverted version of the output of the first storage element to the input of the second storage element during a second operating state. A bi-directional element is connected to receive the output of the second storage element, the bi-directional element feeding the output of the second storage element to an input of the first storage element.

Another aspect of the invention provides a test system in a JTAG-compliant integrated circuit. The test system includes a first storage element and a second storage connected in series with the first storage element. A bi-directional element is connected between an output of the second storage element, the bi-directional element feeding an output of the second storage element to an input of the first storage element. Built-in test logic is configured to provide a test completion signal indicative of completion of a respective test based on a comparison of an output of the first storage element relative to a test value signal. Initialization logic is configured to provide the output of the first storage element to the input of the second storage element unchanged during a first operating state and, depending at least in part on the test completion signal, to provide an inverted version of the output of the first storage element to the input of the second storage element during a second operating state. A clock shaping system is configured to provide an output clock signal to control shifting data through at the first and second storage elements, the output clock signal corresponding to a test clock signal having a substantially fixed duty cycle during the first operating state, the output clock signal corresponding to the test clock signal having one of a selectively adjustable rising edge or falling edge during the second operating state to enable capture of a state change at the output of the first storage element during the second operating state Another aspect of the invention provides a method for input/output characterization of a JTAG-compliant integrated circuit. The method includes initializing at least a first storage element and a second storage element to a starting value, the first storage element and the second element being connected in series between an input and an output of a boundary scan cell. An output of the first storage element is inverted and the inverted output is provided to an input of the second storage element in response to entering a predefined test mode. An output of the second storage element is fed back to an input of the first storage element. A test clock signal is incrementally adjusted during the predefined test mode. It is detected at test logic located within the boundary scan cell whether the output of the first storage element and the output of the second storage element are the same. A test completion signal is provided from the test logic to indicate completion of a respective test for one of a state transition for a rising edge or a state transition for a falling edge.

DETAILED DESCRIPTION

The invention relates to electronic circuits, and more specifically to a built-in self test ("BIST") for input/output (I/O) characterization of an integrated circuit (IC). The systems and methods described herein can be implemented to provide increased efficiency and speed for tests relative to many existing approaches. For instance, the IC typically includes a plurality of boundary scan cells that form a scan chain in the IC. Each boundary scan cell typically includes at least first and second storage elements (e.g., latches or flip-flops) connected together, such as an arrangement of multiplexed shift registers. Each scan cell can also include test logic configured to provide a test completion signal indicative of completion of a respective test based on a comparison of an output of the first storage element relative to a test signal. The test completion signal can be provided to a next boundary scan cell in the scan chain of the IC (e.g., in a daisy chained manner) to indicate to such next scan cell that a respective test has been completed for the boundary scan cell. Initialization logic can be connected between an output of the first storage element and an input of the second storage element to enable the test to be initialized and reset efficiently. Additionally, a clock shaping system can be implemented to provide an output test clock signal having an incrementally adjustable rising edge (e.g., by delaying a test clock signal) during the predefined operating state, which output test clock signal can be used to control propagating signals through the storage elements during the speed test such that the inverted version of the first storage element can be captured within one test clock cycle. The test completion signal can be utilized to increment or adjust the rising edge of the test clock signal.

Figure 1:
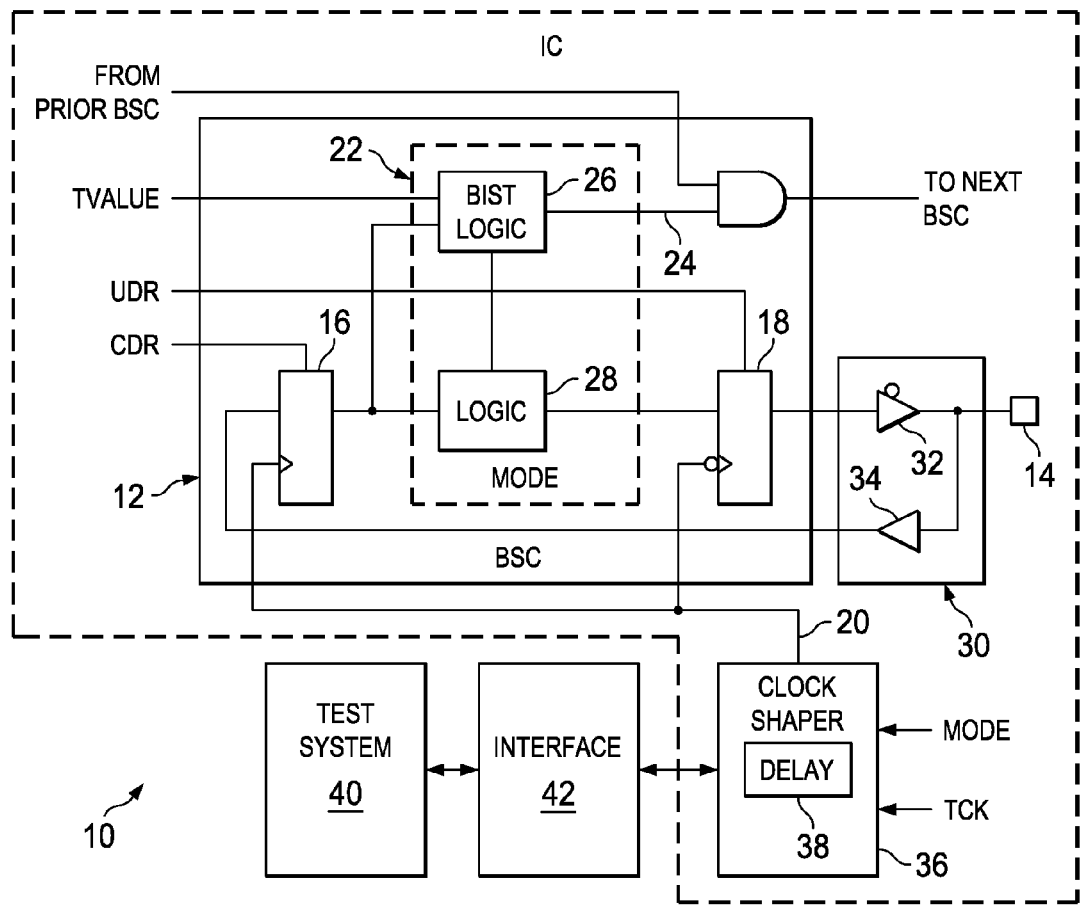
FIG. 1 illustrates an example of a test system for an IC in accordance with an aspect of the invention.

FIG. 1 illustrates an example of a system 10 for performing I/O characterization and testing of an IC according to an aspect of the invention. The system 10 includes one or more boundary scan cells (BSC) 12, such as can be connected between core logic (not shown) and an input or output pad 14 of the IC. The BSC 12 includes at least two storage elements 16 and 18 connected in series within the BSC. The storage elements 16 and 18 can be implemented as a latch, such as in the form of a D flip-flop or other type of circuitry capable of storing and shifting the state of at least one bit in response to a clock signal 20, such as can be derived from a test clock signal (TCK).

The BSC 12 also includes test logic 22 that is configured to perform built-in testing for input/output characterization for the BSC. As a further example, the test logic 22 can include built-in self test (BIST) logic 26 and initialization logic 28. The BIST logic 26 receives as inputs the outputs of the storage elements 16 and 18 and a SELECT signal. The SELECT signal has a value selects the type of test. For instance, the BIST logic 26 can detect the occurrence of a rising edge or a falling edge transition as part of an at-speed test, which type of test can be selected depending on the SELECT signal. The BIST logic 26 is configured to perform logic testing based on a comparison of the output of the storage element 16 and a test signal to provide a corresponding test output signal, indicated at 24. The test output signal 24, for example, can be logically ANDed with a corresponding test completion signal from a prior BSC in the scan chain to provide a corresponding completion (or done) signal a next BSC in the scan chain of the IC such as to indicate completion of the selected test. Thus, the test output signals for each of a plurality of BSCs in the scan chain can be logically ANDed together in a daisy chain configuration.

The initialization logic 28 is electrically connected between the storage elements 16 and 18. In particular, an output of the first storage element 16 is provided to the initialization logic 28 and an output of the initialization logic is provided to an input of the second storage element. The initialization logic 28 can pass either the output of the storage element 16 or an inverted version thereof to the input of the second storage element 18 based on the state of a MODE signal from the BIST logic 26. For instance, the MODE signal can be derived from the test output signal and a predefined test signal that is programmed to initiate and control the operating state of the system 10 for performing a corresponding test. For example, in JTAG-compliant IC, an at speed test capture (ASCAP) instruction can be added to the standard JTAG instruction set to control operation of one or more boundary scan cell or an entire boundary scan chain for performing speed testing according to an aspect of the invention. Thus, the MODE signal can be provided with a state (e.g., a digital value of one or more bits) that indicates the ASCAP instruction has been loaded into an instruction register during a run test idle state of the JTAG state machine and the test has not yet been completed. Upon completion of the test, the mode signal can change states such that the initialization logic will pass the output of the first storage element 16 to the input of the second storage element 18.

A bi-directional element 30 receives the output of the second storage element 18. In the example of FIG. 1, the bi-directional element 30 is configured to drive the pad 14 with an output signal corresponding to the output from the storage element 18 and concurrently feed the output signal to an input of the first storage element 16. For instance, the bi-directional element can replace an input only pad or an output only pad of an IC to enable characterization and speed testing described herein. The bi-directional element 30 can include a pair of buffers (e.g., drivers) 32 and 34, one buffer 32 being connected to pass the signal from the BSC 12 to the pad 14 and the other buffer 34 being connected to drive an input of a respective storage element 16 of the BSC 12. Thus, the bi-directional element 30 forms a loop with the BSC 12 for cycling data through the BSC 12 to allow speed testing and other I/O characterization to be performed.

The system 10 can also include a clock shaper 36 that provides the output clock signal 20 to at least the BSC 12. In a JTAG-compliant IC, clock signal 20 can be provided to the entire boundary scan chain. The clock shaper 36 provides the clock signal 20 in response to the test clock (TCK) signal. For instance, the clock shaper 36 can provide the output clock signal 20 as either the TCK signal or as delayed version of the TCK signal while performing the built-in self test. During a first operating state (e.g., not corresponding to an ASCAP mode), for example, the clock shaper 36 can selectively provide the output clock signal 20 as an unmodified version of the TCK signal. The clock shaper 36 can include a delay network 38 that can be activated to implement an incremental amount of delay on an inverted TCK signal. The amount of delay can be selectively adjusted for providing the delayed version of the inverted TCK signal, such as may be incrementally adjusted based on the results of the test (e.g., the test output signal 24). The delayed version of the inverted TCK signal thus defines the rising edge of the output clock signal 20 during the second (or BIST) operating state. The amount of delay can be adjusted (e.g., increased or decreased) during a test process, such as to ascertain an amount of time required for propagating a signal through the input or output path that includes the BSC 12.

To measure the propagation time or other test parameters a test system 40 can be coupled to the system through an interface 42 implemented in the IC. For the example of a JTAG-compliant IC, the interface can be a standard JTAG interface, such as a test access port (TAP) interface configured to communicate with the BSC. In such example, the test system 40 can measure data from the BSC 12 and/or from the clock shaper 36 via the TDO of the JTAG interface. The test system 40 can also control the clock shaper 36 via the TDI of the JTAG interface. To help reduce manufacturing costs, the test system 40 can be implemented as part of test equipment external to the IC. The test system 40 thus can initiate the test via the interface 42, set a desired value into the storage elements, adjust the delay to provide the output test clock signal and monitor the test output 24 of one or more BSC. As the amount of delay is varied, the test system 40 can determine the propagation time for a signal through the BSC 12 and the bi-directional element based on the amount of delay and the test output signal 24. Since the BIST logic 26 is configured to perform the testing within a given BSC 12, the test system 40 and interface 42 can be employed to run the test and verify the response.

Figure 2:
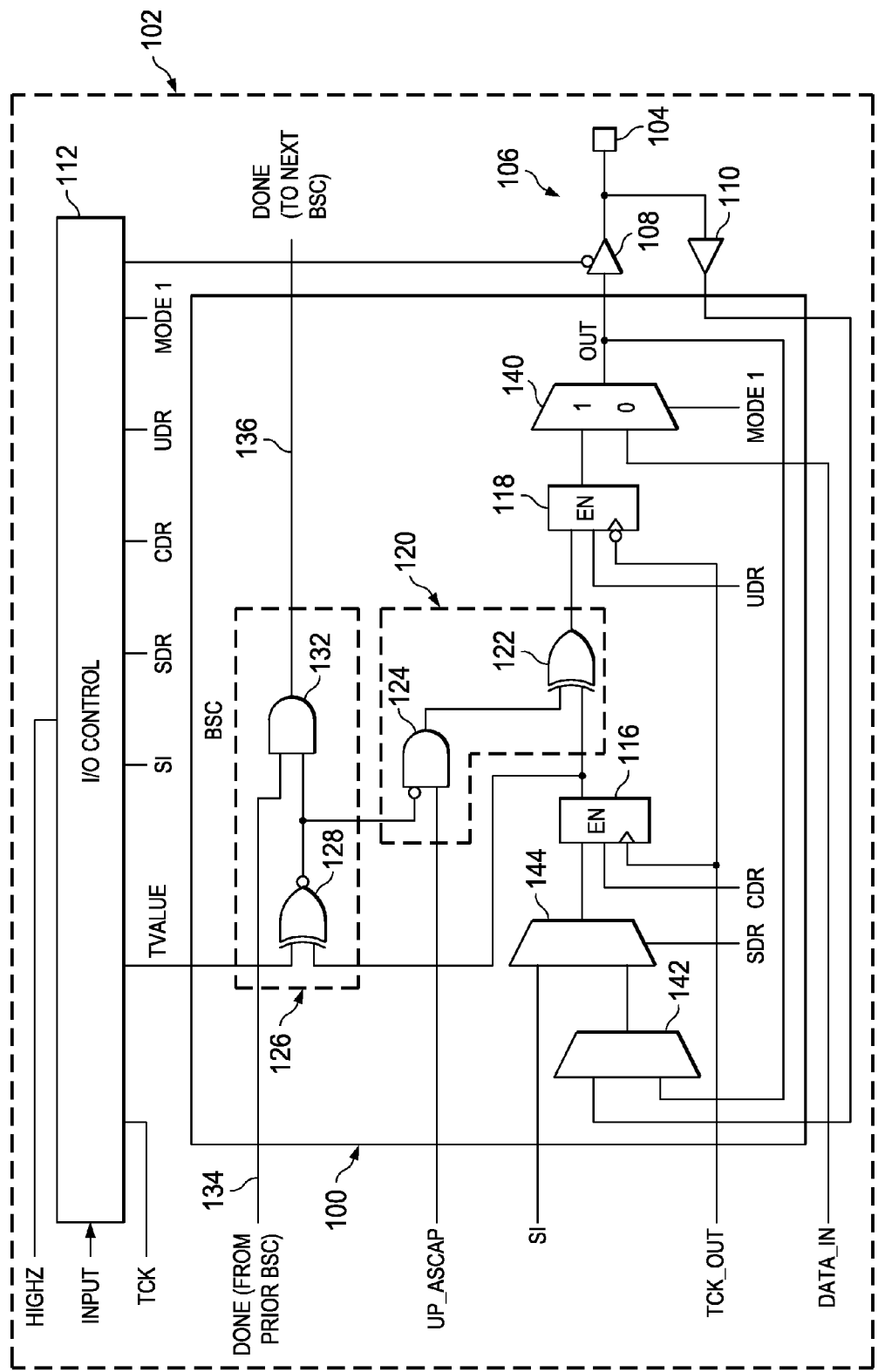
FIG. 2 illustrates an example of a boundary scan cell architecture that can be implemented in accordance with an aspect of the invention.
Figure 7:
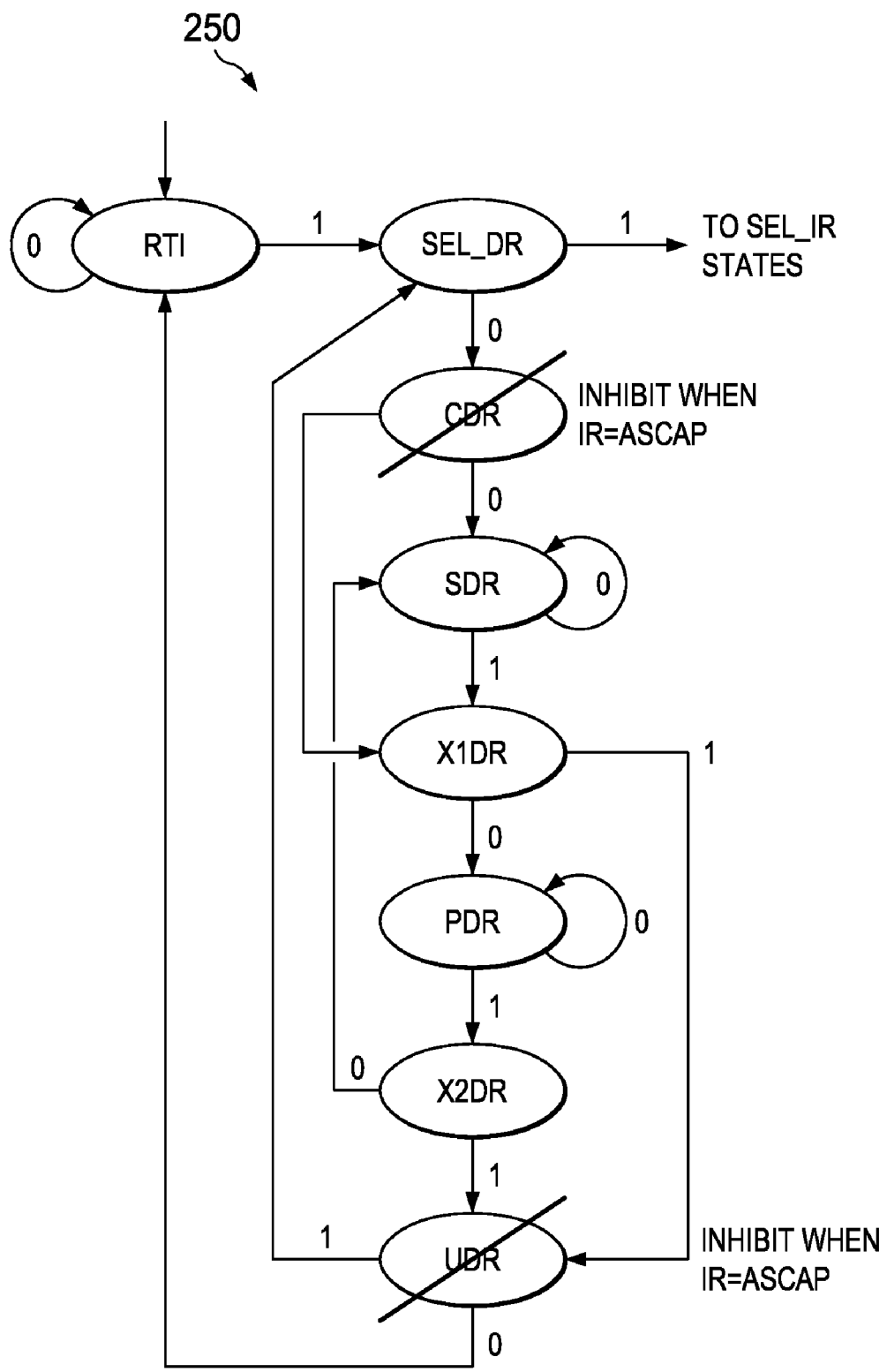
FIG. 7 illustrates an example of a state diagram for a JTAG-compliant device implementing a test in accordance with an aspect of the invention.

FIG. 2 depicts an example of a BSC 100 that can be implemented in a JTAG-compliant IC, schematically indicated by a dashed line at 102, according to an aspect of the invention. The BSC 100 includes an arrangement of multiplexers and flip-flops arranged to control propagation of signals through the BSC in manner that varies based on whether the IC 102 is operating in a JTAG test mode and the state of the test mode. An example of the JTAG states is shown in FIG. 7. The BSC 100 is coupled with a pad 104 through a bi-directional element 106. The bi-directional element 106 can include a pair of buffers (e.g., drivers) 106 and 108. For instance, one buffer 108 is connected to pass the signal from the BSC 100 to the pad and the other buffer 110 is configured to feedback the signal from the output of the buffer 108 at the pad 104 to an input of the BSC.

The IC 102 also includes an I/O control block 112 that is associated with the BSC 100. The I/O control block 112 can be configured to control the bi-directional element 106 as well as to control operation of the BSC 100. The I/O control block 112, for example, can vary the control based on a state of the JTAG state machine, such as can be defined register values, including a shift-data register (SDR) state, a capture-data register (CDR) state and a update-data register (UDR) state. The timing of such control can be established by the JTAG TCK signal. The I/O control block 112 can also receive a SERIAL INPUT (SI) signal that can be shifted into the BSC. The SI signal, for example, can be provided from TDI or it can be provided from a preceding BSC in a scan chain, such as where the BSC 100 is not the first BSC in the chain. Additionally, the operation of the I/O control block 112 can depend on a given operating mode, such as defined by a MODE1 signal, which (in FIG. 2) the MODE1 signal can indicate whether the IC 102 is in a test mode in which the JTAG functionality is enabled or a normal IC operating mode in which the JTAG functionality is disabled.

In the example of FIG. 2, the BSC 100 includes a pair of flip-flops (FFs) 116 and 118 connected in series. Each of the FFs 116, 118 is activated to latch (or shift) its input to its respective output based on the output test clock (TCK_OUT) signal. For example, FF 116 is configured to shift its input to its output on a rising edge of TCK_OUT and the FF 118 is configured to shift its input to its output on a falling edge of TCK_OUT. It will be appreciated that other clocking schemes can be utilized, such as a scheme that might violate the JTAG standard.

The BSC 100 includes initialization logic 120 that is configured to enable the output of the FF 116 to be inverted to an input of the FF 118 as part of a built-in test. The initialization logic 120 includes an Exclusive-OR (XOR) gate 122 connected between the FFs 116 and 118. The output of FF 116 is coupled to a first input of the XOR gate 120 and a logic output signal from an AND gate 124 is provided to the other input of the XOR gate. The AND gate 124 receives an update at speed capture (UP_ASCAP) control signal at a first input thereof and receives a DONE signal from BIST logic 126. For instance, the UP_ASCAP signal is provided as an input to the BSC to indicate that a JTAG instruction register is set to update ASCAP, which can be implemented while the RTI state is asserted (high) and a RESET_EDGE state is not asserted (e.g., UP_ASCAP=(IR==ASCAP)& RTI&!RESET_EDGE). Thus, when the output of the AND gate 122 is high, the XOR gate provides an inverted version of the output of the FF 116 to the input of FF 118. The XOR gate 122 further causes the output of FF 116 to be passed directly to FF 118 if the test is completed (e.g., DONE is high) or if the UP_ASCAP is not asserted. Those skilled in the art will understand and appreciate that other logic, combinational logic (e.g., multiplexer) or other circuitry can be employed to invert the output of the FF 116 according to an aspect of the invention to initialize and control the test process.

The BIST logic 126 is configured to perform self-testing and I/O characterization for the BSC. In the example of FIG. 2, the BIST logic 126 can be configured to determine whether a given logic condition exists based on the output of the FF 116 and the output of the FF 118. The BIST logic can also be configurable during operation to select a particular aspect of the test condition, such as in response to a test value (TVALUE) signal from the I/O control 112. In the example of FIG. 2, the BIST logic 126 includes an XNOR gate 128 that receives the outputs of the FFs 116 and TVALUE and provides an output indicating if the signals are the same and thus the test on BSC 100 is done. The TVALUE signal thus controls whether the BIST logic 126 is being employed for a state transition for testing a rising edge or a state transition for testing a falling edge. The XNOR gate 128 provides an output DONE signal indicating whether the testing is completed for the BSC 100. The DONE signal can be provided to an input of an AND gate 132 where it is logically ANDed with an output signal (DONE signal, indicated at 134) from a preceding BSC in the scan chain to provide a corresponding output at 136. If the BSC is the first BSC in the chain, the input 134 can be hardwired to logic 1. Thus, the DONE signals from the BSCs in the scan chain can be daisy chained together, which aggregated output can be monitored to provide an indication when the testing has been completed for the entire scan chain.

The following is an example of a Table of values that representing signals in the BSC 100 associated with performing a built-in test for a rising edge (RE) transition and a falling edge (FE) transition for the BSC 100.

| TVALUE | CDR | UDR | DONE | DESCRIPTION |
|--------|-----|-----|------|-------------|
| 0 | 0 | 0 | 1 | Disable local test, pass DONE to next BSC, FE is captured |
| 0 | 0 | 1 | 0 | Invalid state |
| 0 | 1 | 0 | 0 | Test in progress |
| 0 | 1 | 1 | 0 | Start value to test FE |
| 1 | 0 | 0 | 0 | Start value to test RE |
| 1 | 0 | 1 | 0 | Test in progress |
| 1 | 1 | 0 | 0 | Invalid state |
| 1 | 1 | 1 | 1 | Disable local test, pass DONE to next BSC, RE is captured |

An output multiplexer 140 is connected between the FF 118 and the bi-directional element 106. The multiplexer 140 provides a corresponding output signal based on the MODE1 signal. For example, the multiplexer 140 can pass the output of the FF 118 to the buffer 108 of the bi-directional element 106 when the MODE1 signal has a first state (e.g., 1, corresponding to a test mode). Alternatively, the multiplexer 122 can pass a DATA_IN signal, such as corresponding to an output from core logic (not shown) of the IC 102, when the MODE1 signal has a second state (e.g., 0, corresponding to a normal IC operating mode). The buffer 108 drives the output of the multiplexer 122 to the pad 104.

The buffer 110 of the bi-directional element 106 further feeds back such output to an input of the BSC 100. In the example of FIG. 2, the buffer 110 provides the output to an input of a multiplexer 142. The output of the multiplexer 140, corresponding to the input to the buffer 108, is provided as a second input to the multiplexer 142. The I/O control block 112 provides a control signal to select one of the inputs of the multiplexer 142, which selection may vary according to the MODE1 signal and other logic performed within the I/O control. The multiplexer 142 provides its output to an input of another multiplexer 144. The multiplexer 144 also receives an input signal from the I/O control, such as the SI signal, which may be may correspond to or be derived from the TDI of a JTAG interface, for example. The state of the SDR signal can be utilized to select which of the inputs the multiplexer 144 provides at the input of the FF 116.

Thus, with a proper set of states during the test mode (e.g., MODE1=1 and RTI & IR=ASCAP &! RESET_EDGE), the FF 116 will be activated to provide for detection of a state change at its output that can be compared with TVALUE by the BIST logic 126. The detection of the state change at the output of FF 116, which matches TVALUE, can be measured to characterize timing of the I/O path through the BSC and the bi-directional element 106.

As described herein, an inverted TCK signal can be incrementally delayed during a test cycle to provide an incrementally variable rising edge of the TCK_OUT signal to ascertain timing requirements to enable at speed testing and comparison of the outputs of the FFs 116 and TVALUE. This control of the rising clock edge can be performed by a clock shaper, such as shown and described herein. By controlling the amount of delay to be much less than a single TCK cycle, the detection of the inverted value of FF 116 by the BIST logic 126 can be performed in less than one TCK cycle. Additionally, the DONE signal can be utilized to cause an the incremental change in the rising edge of the TCK_OUT signal so that additional external controls are not necessary to perform the testing and to further simplify the testing process. The resolution and accuracy of this characterization may vary depending on how the incremental delay for the TCK_OUT signal is implemented.

Figure 3:
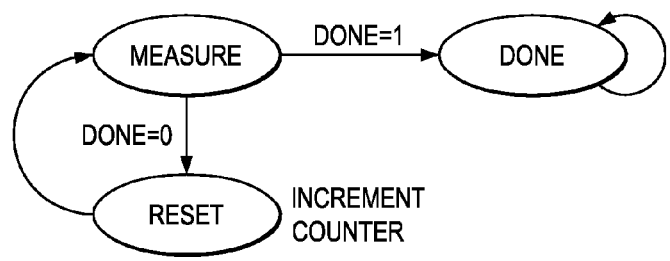
FIG. 3 depicts an example of a state diagram associated with performing a test in a boundary scan cell according to an aspect of the invention.

FIG. 3 depicts a state diagram for a run-test-idle (RTI) sequence that can be utilized for measuring the test results from BIST logic implemented in the BSCs. As shown, the RTI sequence includes a measurement state in which the outputs can be measured to determine if the test condition has been met. If the test condition is met (e.g., based on a comparison of the outputs of the FFs 116 and TVALUE in FIG. 2), the sequence transitions to the DONE state. If the test condition has not been met (e.g., the outputs of the FFs 116 and TVALUE in FIG. 2 are not the same), the sequence transitions to a RESET state, in which the test can reset the edge for a next part of the test cycle. Additionally, the delay counter can automatically increment (or decrement) in the RESET state in response to detecting a falling edge of the TCK clock signal. After the RESET state, the sequence returns to measure the test results to determine if the test has completed.

Figure 4:
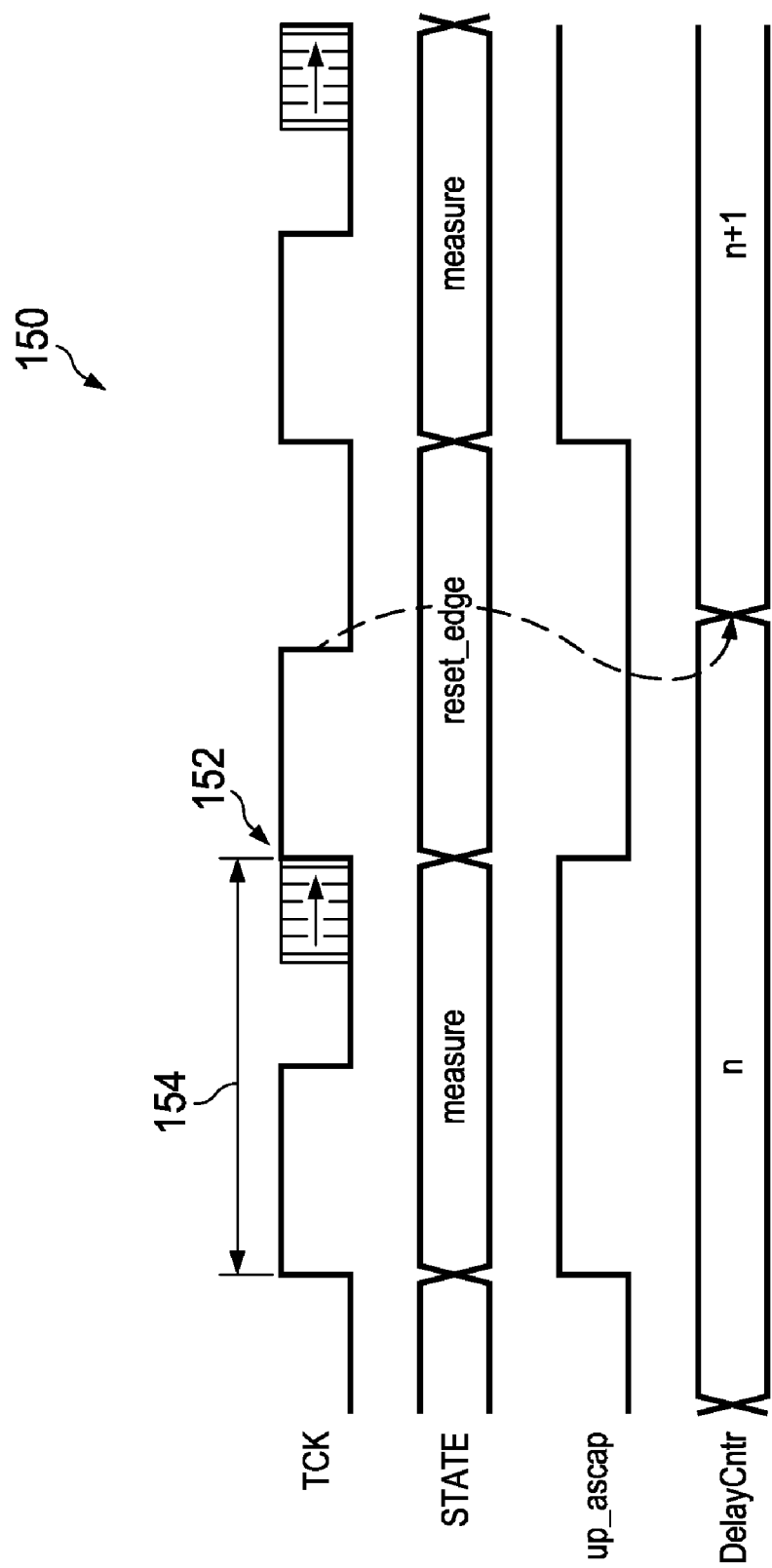
FIG. 4 is a timing diagram illustrating the relationship of certain signals during a test implemented in accordance with an aspect of the invention.

An example of signal timing during at speed testing for a BSC implemented in a JTAG-compliant IC according to an aspect of the invention will be better appreciated with reference to the timing diagram 150 of FIG. 4. In particular, FIG. 4 demonstrates the relationship between the output clock signal TCK, the RTI sequence for the JTAG state machine, the UP_ASCAP signal and the delay counter. The timing relationships will be referenced back to the parts of the BSC discussed above with respect to FIG. 2.

By way of example, the speed test state can be entered whenever the corresponding test instruction (ASCAP) is loaded into the instruction register while the RTI state of the state machine is asserted (e.g., high). Due to operation of the initialization logic, an inverted version of the output of the first FF 116 provided at the input of the second FF 118. This inverted version of the output of the FF 116 is latched to the output of the FF 118. While the UP_ASCAP signal is asserted during the MEASURE state of the RTI sequence, the DONE signal from the BIST logic can be monitored. The output clock TCK signal has a rising edge 152, which can vary in time according to the value of the delay counter. For instance, if the test is not completed when the rising edge of the TCK signal occurs, the counter can automatically increment (e.g., from N to N+1) at the following falling edge of the TCK signal while in the reset_edge state of the RTI sequence. As a result, the rising edge of the TCK signal will be adjusted in time for the next measurement state through the addition (or subtraction) of delay. The RESET_EDGE state is also when FF 118 is reset back to the same state as FF 116 (without inversion) which resets the test before the next measurement cycle without having to re-enter the SDR state.

This process can repeat internally in a given BSC until the testing is completed, such as in response to detecting a match by the BIST logic (e.g., corresponding to the DONE state of the RTI sequence). The delay counter value that results in the DONE signal transitioning from a pass to a fail (or from a fail to a pass) can be used to identify a minimum amount of time required for propagating signals at a given I/O. As mentioned above, this determination of whether an I/O passes (or fails) can be made within a single TCK cycle or period for a given test, indicated at 152, which also corresponds to the measurement part of the RTI sequence. It will be appreciated that such aggregate testing for the set of BSCs can be implemented with relatively small cost of modifying a standard JTAG architecture. The I/O characterization can be performed for any one or more selected pin of the IC.

Figure 5:
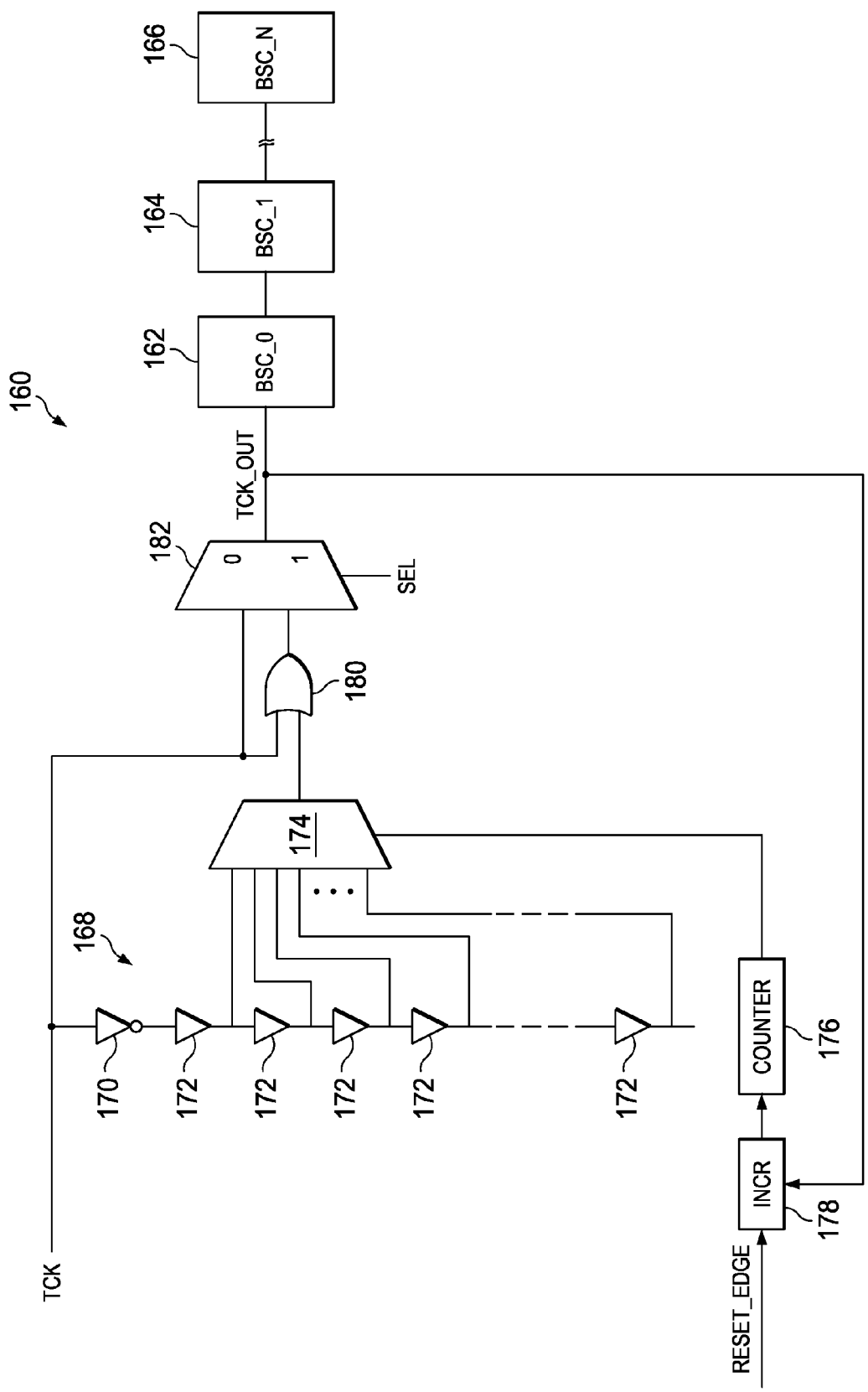
FIG. 5 illustrates an example of a clock shaping system that can be utilized in a test system in accordance with an aspect of the invention.

FIG. 5 depicts an example of a clock shaper 160 that can be utilized to delay an inverted version of the TCK signal, depicted as TCK_OUT. The clock shaper 160 can provide the TCK_OUT signal to a scan chain of N boundary scan cells 162, 164 and 166, which collectively form a boundary scan register of an IC (where N is a positive integer N>1 denoting the number of boundary scan cells). In the example of FIG. 5, the TCK signal is provided to an input of a delay line 168, which includes an inverter 170 serially connected with a plurality of buffers 172. The output of each buffer 172 can be provided to a respective input to a multiplexer 174. Each buffer 172 implements a known amount of delay, which may be the same or different, on the inverted version of the TCK signal, such that each buffer output produced a selectable rising edge that can be provided as the rising edge of the TCK_OUT signal. A delay selection signal can be provided to select a desired amount of delay for the inverted version of TCK. As one example, a counter 176 can be incremented (e.g., up or down) to a value that defines the amount of delay for the inverted TCK signal according to which multiplexer input is selected. Those skilled in the art will appreciate various ways to increment the counter 176. For the example of a built in logic test, an increment logic block 178 can increment the counter based on the TCK_OUT signal and the state of the RTI sequence indicating that the test has not completed. From the example RTI state of FIG. 4, the not-done state thus can be represented as the reset_edge state. Thus, the counter can increment once per TCK_OUT cycle during the RTI state. The counter 176 may be adjusted (up or down) by any number of one or more count values for each increment. The amount of delay associated with the delay line 168 can be ascertained by employing a ring oscillator connected to the delay line.

The multiplexer 174 provides an output signal corresponding to an inverted TCK signal having a selected amount of delay to an OR gate 180. The OR gate 180 performs a logical ORing function of the multiplexer output with the TCK signal to an input of another multiplexer 182. The inverted version of TCK thus provides the rising edge of the TCK_OUT signal. The TCK signal also is provided to another input of the multiplexer 182. The multiplexer 182 provides the TCK_OUT signal to the scan chain based on a selection (SEL) signal. The selection signal has a value that depends on the state of the JTAG state machine and on what test instruction is loaded in the JTAG instruction register. For example, the delayed, inverted version of TCK is provided as the TCK_OUT signal from the multiplexer 182 if the ASCAP instruction is loaded in the JTAG instruction register while the RTI state is asserted. Otherwise, the multiplexer 182 provides the TCK_OUT signal as the TCK signal (not modified). Those skilled in the art will understand and appreciate other configurations of clock shaper circuitry that can be utilized to provide a variable rising edge for a TCK signal. Alternatively, a variable rising edge of the TCK_OUT signal could be provided from other clock generating circuitry (e.g., internal or external to the IC), such as during the test mode, to enable speed testing according to an aspect of the invention.

Figure 6:
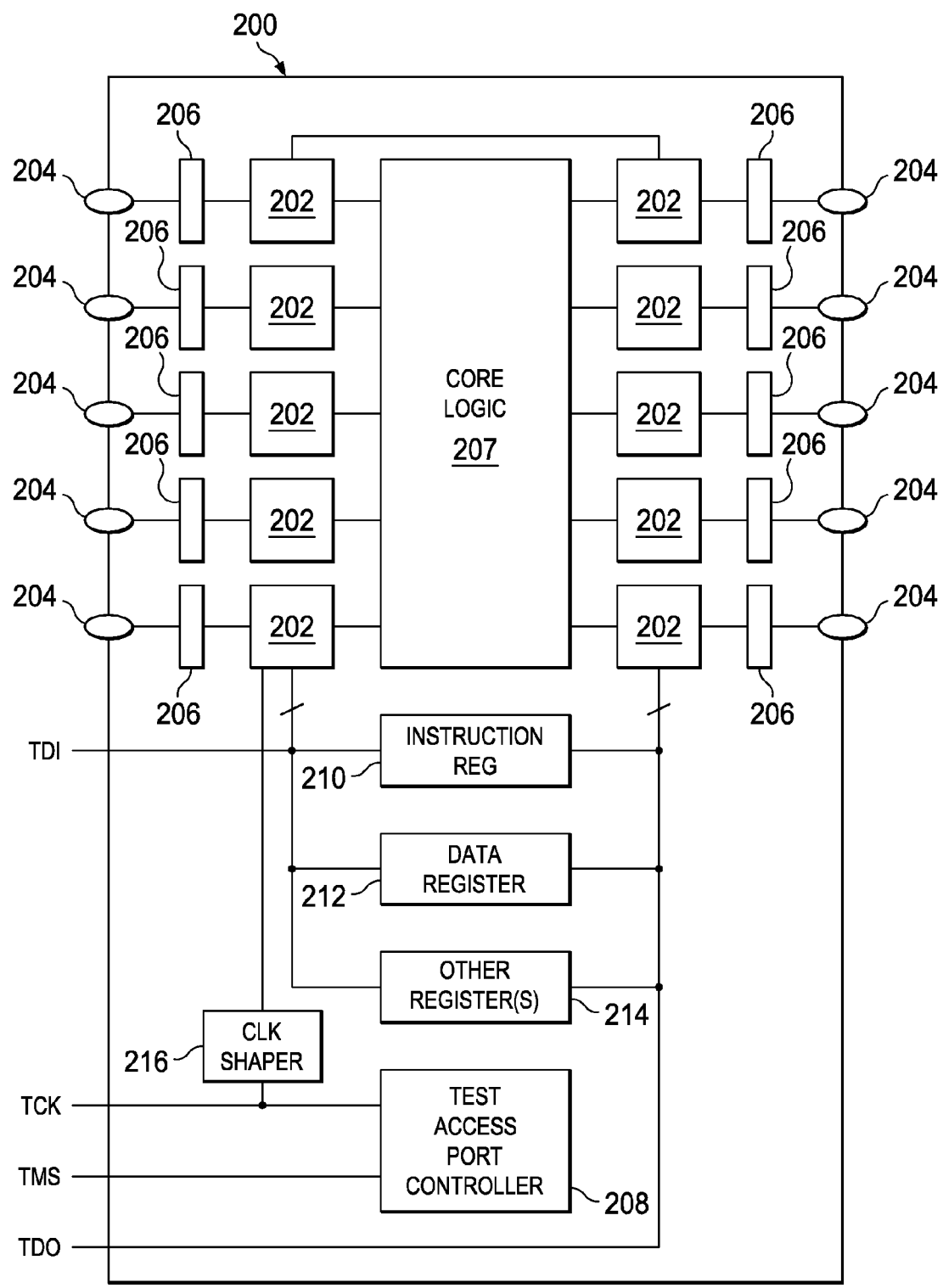
FIG. 6 depicts an example of a JTAG-compliant IC that can be implemented according to an aspect of the invention.

FIG. 6 depicts an example of a JTAG-compliant IC 200 that can be configured to perform testing, such as speed testing and I/O characterization, according to an aspect of the invention. The JTAG-compliant IC 200 includes a plurality of BSCs 202, such as one BSC for each of a plurality of I/O pins 204. Each BSC 202 is coupled to its respective PIN through a bi-directional element 206. Each BSC 202 is also connected to core logic 207 of the IC (e.g., application specific logic and other functional circuitry). A 'scan path' or 'scan chain' connects the BSCs 202 together in a serial manner. The IC 200 also includes an interface (e.g., a test access port (TAP)) that can include a plurality of additional I/O pins to handle the JTAG signals for controlling and monitoring boundary scan testing. The interface can include a test data input (TDI) pin, a test mode signal (TMS) pin, a TCK pin, and a test data output (TDO) pin. The IC 200 also includes a TAP controller or state machine 208 that controls the states of operation of the boundary-scan testing. The TMS and TCK pins are used to control transitions between states, such as will vary depending on the data in the registers 210, 212 and 214.

During a normal operating mode, the BSCs 202 simply let the I/O signals pass into and out of the I/O pins 204. When the device is placed under a 'Test' mode, the boundary cells become 'active' for use in the direct capture or control of the signals going into and out of the I/O circuitry of the IC 200, circumventing the device's normal input and output connections. Each BSC 202 can include a set of multiplexed shift-registers that are located around the IC's periphery in combination with built in self-test logic, such as can be configured as shown and described with respect to FIGS. 1 and 2. The TDI pin is a serial data input to the JTAG instruction register 210, to the user data register 212 and to one or more other registers 214 that can be utilized in a JTAG-compliant device. The state of the TAP controller 208 as well as the particular instruction held in the instruction register 210 determines which register is fed by TDI for a given operation.

The IC 200 also includes a clock shaper 216 that is configured to perform clock shaping on the TCK signal for providing an output clock signal to the boundary scan chain. As described herein, clock shaper 216 can include a delay network configured to delay an inverted TCK signal as to provide the output clock signal TCK_OUT. By selectively controlling the amount of delay (e.g., incrementally increased or decreased), the clock shaper 216 can provide a variable adjustment to the rising edge of the output TCK signal to facilitate testing and I/O characterization according to an aspect of the invention. An example embodiment of the clock shaper 216 is shown and described with respect to FIG. 5. The TDO pin is the serial data output for all JTAG instruction and data registers. The state of the TAP controller as well as the particular instruction held in the instruction register determines which register feeds TDO for a specific operation. For example, the TDO pin can be employed to access the output of a FF or other storage element of a selected BSC 202 during a speed test for use in characterizing the I/O path as described herein.

FIG. 7 depicts an example of a JTAG state machine 250 and how its operation can be modified to perform built-in testing according to an aspect of the present invention. The state machine 250 is controlled by the TCK and TMS inputs. For instance, these two inputs determine whether an instruction register scan or data register scan is performed. The state machine 250 consists of a small controller design, driven by the TCK input, which responds to the TMS input as shown in the state diagram in FIG. 7.

For the data register path of the state machine, there are shown the following steady states: Run-Test/Idle (RTI), Shift-DR (SDR), and Pause-DR (PDR). At power up, or during normal operation of the host IC, the TAP is forced into the Test-Logic-Reset state by driving TMS high and applying five or more TCKs. In this state, the TAP issues a reset signal that places all test logic in a condition that does not impede normal operation of the host IC. When test access is required, a protocol is applied via the TMS and TCK inputs, causing the TAP to exit the Test-Logic-Reset state and move through the appropriate states.

The RTI state allows certain operations to occur depending on the current instruction that is loaded into the instruction register. From the Run-Test/Idle state, a data register scan can be issued to transition the state machine 250 through the appropriate states shown in FIG. 7. For simplicity of explanation the states associated with the instruction register scan have been omitted.

By way of example, SEL_DR scan state can be entered prior to performing a scan operation on a data register or in passing to the Select-IR scan state. From the SEL_DR scan state, the state machine 250 can transition to the CDR state (at TMS=0), which allows data to be loaded from parallel inputs into the data register selected by the current instruction on the rising edge of TCK. The capture occurs on rising edge of the output TCK signal provided by the clock shaper. According to an aspect of the invention, the normal operation of loading the parallel inputs into the data register can be inhibited when a predefined instruction, the ASCAP instruction, is loaded into the instruction register (IR=ASCAP). When the ASCAP instruction is active, CDR occurs during the MEASURE state of RTI. For example, the clock shaper can cause the rising edge of the TCK to incrementally vary to ascertain timing requirements for propagating a signal through the I/O path. The timing requirements can be determined in according to the time required to detect that a test has completed (e.g., assertion of a DONE signal), such as described herein. From CDR state, the state machine transitions to the SDR state (at TMS=0) or it can transition to the Exit1-DR (X1DR) state (at TMS=1).

The SDR state shifts the data, in the currently selected register, towards TDO by one stage on each rising edge of the output TCK after entering this state. The state machine 250 can transition from the SDR to the X1DR state depending on the TMS input (at TMS=1). The X1DR state is a temporary state that allows the option of passing on to the Pause-DR (PDR) state (at TMS=0) or transitioning directly to the Update-DR state (at TMS=1). The PDR state is a wait state that allows shifting of data to be temporarily halted. The state machine can remain in PDR (at TMS=0) or transition to the Exit2-DR (X2DR) state (at TMS=1). The X2DR state is a temporary state that allows the option of passing on to the UDR state (at TMS=1) or returning to the SDR state (at TMS=0) to continue shifting in data depending on the value of the TMS input. The UDR state causes the data contained in the currently selected data register to be loaded into a latched parallel output (for registers that have such a latch) on the falling edge of TCK after entering this state. The parallel latch prevents changes at the parallel output of these registers from occurring during the shifting process. According to an aspect of the invention, the normal operation performed during the UDR state can be inhibited while the ASCAP instruction is loaded into the instruction register. When the ASCAP instruction is active, UDR occurs in the MEASURE state of RTI. From the UDR state, the state machine can resume the data register operations by returning to the SEL_DR state (at TMS=1) or operations can be terminated by entering the RTI state (at TMS=0).

Figure 8:
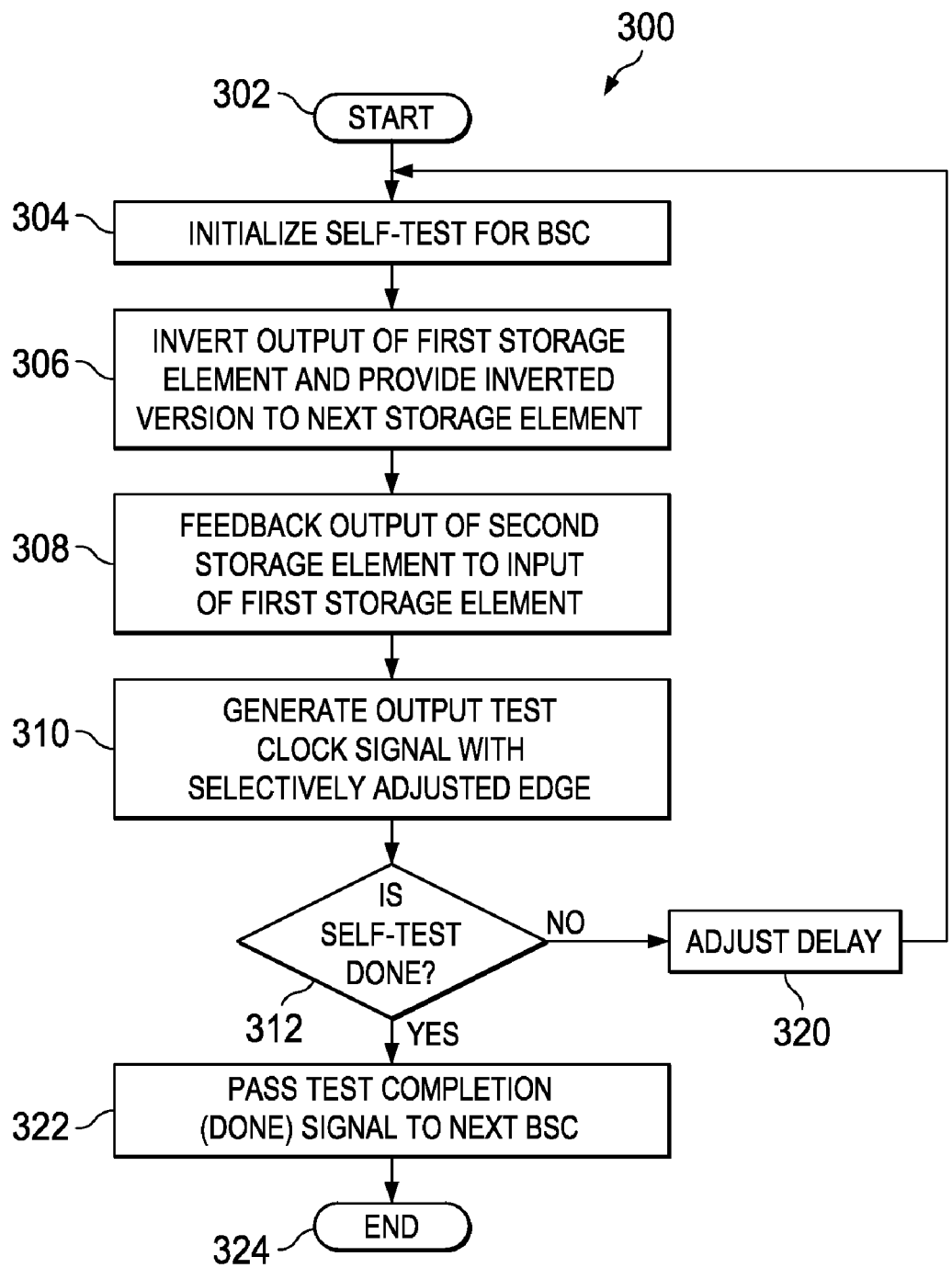
FIG. 8 depicts an example of a method for performing a test according to an aspect of the invention.

In view of the foregoing structural and functional features described above, certain methods will be better appreciated with reference to FIG. 8. It is to be understood and appreciated that the illustrated actions, in other embodiments, may occur in different orders and/or concurrently with other actions. Moreover, not all illustrated features may be required to implement a method.

FIG. 8 illustrates a method 300 for input/output characterization of a JTAG-compliant integrated circuit. The method 300 begins at 302 such as in response to entering a predefined test mode, such as the ASCAP mode while in the RTI state of the JTAG state machine. The test mode includes setting test parameters, such as a test value indicating whether the self-test is for a rising edge transition or a falling edge transition. At 304, the testing process can be reset (or initialized) to a desired starting value. As described herein, the first storage element and the second element can be connected in series between an input and an output of a BSC. It is to be appreciated that the method 300 can be performed with respect to any number of one more BSCs in the JTAG-compliant IC, such as shown and described herein.

At 306, an output of the first storage element is inverted by initialization logic and the inverted output is provided (either directly or through other circuitry) to an input of the second storage element in response to entering a predefined test mode. At 308, an output of the second storage element is fed back to an input of the second storage element. For example, the output can be fed back by a bi-directional element that is connected between the output of the second storage element and a pad of the IC. At 310, an output test clock signal is generated with a selectively adjustable edge during the predefined test mode (e.g., the ASCAP mode). For example, the delayed and inverted version of the test clock signal can be logically ORed with the test clock signal to provide the incrementally adjusted test clock signal. It will be appreciated that the output clock signal can be provided with either a selectively adjustable rising edge or a selectively adjustable falling edge during the predefined test mode, such as may depend on the configuration of the IC. An adjustable rising edge can be used for capturing the output of a CDR for a JTAG compliant device. If the device were not strictly JTAG compliant, a different edge (i.e., a falling edge) could be utilized for I/O testing similar to that described herein.

At 312, a determination is made as to whether the built-in self test for a given BSC has been completed. If the test is not DONE (NO), the method can proceed to 314 in which the amount of delay for the output test clock signal can be adjusted, such as by incrementing or decrementing a counter. For example, the amount of delay can be adjusted in response to the falling edge of the output test clock signal occurring while the test has not completed (e.g., DONE=false). From 320, the method can return to 304 to repeat the test (from 304-312) for the next delay value.

If at 312, it is determined that the test is DONE (as indicated at the output of built-in test logic), the method can proceed from 312 to 322 where the DONE signal can be provided to the next BSC in a scan chain. At 324, the method ends for the BSC. As described herein, the assertion of the DONE signal can be used to characterize the timing for a given pad of the IC or for each pad in the IC. A determination of such I/O timing can be determined internally in the IC based on the amount of delay implemented by a delay line, such as can depend on a counter value (see, e.g., FIG. 4). In view of the foregoing, it will be appreciated that speed tests and other I/O characterization can be implemented with reduced ATE time.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A test system in an integrated circuit, the test system comprising:
   at least one boundary scan cell, the at least one boundary scan cell comprising:
      a first storage element;
      a second storage element connected in series with the first storage element; and
      test logic configured to provide a test completion signal indicative of completion of a respective test based on a comparison of an output of the first storage element relative to a test value signal (TVALUE), the test logic further configured to provide the output of the first storage element to the input of the second storage element unchanged during a first operating state and, depending at least in part on the test completion signal, to provide an inverted version of the output of the first storage element to the input of the second storage element during a second operating state; and
   a bi-directional element connected to receive the output of the second storage element, the bi-directional element feeding the output of the second storage element to an input of the first storage element.

2. The test system of claim 1, wherein the test logic further comprises:
   compare logic configured to detect if the output of the first storage element relative to TVALUE are the same; and
   selection logic configured to control whether the output signal of the test logic indicates one of a state transition for a rising edge or a state transition for a falling edge.

3. The test system of claim 2, wherein the compare logic comprises an Exclusive-OR element that receives the output of the first storage element and TVALUE;
   wherein the selection logic receives an output of the Exclusive-OR element and a selection signal, the selection signal being provided to control testing for a rising edge or a falling edge.

4. The test system of claim 1, wherein the test logic further comprises initialization logic having a first input connected with the output of the first storage element and a second input that receives a second signal, which varies as a function of the test completion signal, to define at least one of the first operating state and the second operating state.

5. The test system of claim 4, further comprising a plurality of the boundary scan cells connected in series to define a boundary scan chain of the integrated circuit, the integrated circuit being a JTAG-compliant integrated circuit, further comprising an interface for controlling the operating state of the plurality of boundary scan cells and for evaluating the output of the first storage element for at least one of the plurality of boundary scan cells.

6. The test system of claim 5, wherein the test logic for at least some of the plurality of boundary scan cells further comprises an AND function that logically-ANDs the test completion signal for a given boundary scan cell with the test completion signal from a preceding boundary scan cell of the boundary scan chain.

7. The test system of claim 1, further comprising a clock shaping system configured to provide an output clock signal, the output clock signal corresponding to a test clock signal during the first operating state and corresponding to the test clock signal having a selectively adjustable rising edge during the second operating state to enable capture of the state change at the output of the first storage element within one test clock cycle.

8. The test system of claim 7, wherein the clock shaping system further comprises a delay network that implements an incremental amount of delay on an inverted version of the test clock signal to provide the selectively adjustable rising edge of the test clock signal during the second operating state, the incremental amount of delay incrementing depending on a transition in the test clock signal and a state of a JTAG state machine.

9. The test system of claim 8, further comprising a counter that provides a counter value that is incremented to select the incremental amount of delay implemented by the delay network, the counter being incremented automatically in response to a transition in the test clock signal occurring prior to completion of the respective test.

10. The test system of claim 9, wherein the interface further comprises a JTAG test access port controller having a plurality of test states, normal activities during at least one of an Update-DR state and a Capture-DR state of the JTAG test access port controller being inhibited during the second operating state to facilitate capture of the state change at the output of the first storage element.

11. The test system of claim 1, wherein the second operating state is entered into in response to a predetermined test instruction being loaded into an instruction register during a run-test-idle state of a state machine being inhibited during the second operating state.

12. The test system of claim 11, wherein the second operating state defines an at speed capture mode designed for characterizing a length of time required for propagation of a signal to one of an input and an output of the integrated circuit.

13. A test system in a JTAG-compliant integrated circuit, the test system comprising:
   a first storage element;
   a second storage connected in series with the first storage element;
   a bi-directional element connected between an output of the second storage element, the bi-directional element feeding an output of the second storage element to an input of the first storage element;
   built-in test logic configured to provide a test completion signal indicative of completion of a respective test based on a comparison of an output of the first storage element relative to a predetermined test value (TVALUE);
   initialization logic configured to provide the output of the first storage element to the input of the second storage element unchanged during a first operating state and, depending at least in part on the test completion signal, to provide an inverted version of the output of the first storage element to the input of the second storage element during a second operating state; and
   a clock shaping system configured to provide an output clock signal to control shifting data through at the first and second storage elements, the output clock signal corresponding to a test clock signal having a substantially fixed duty cycle during the first operating state, the output clock signal corresponding to the test clock signal having one of a selectively adjustable rising edge or falling edge during the second operating state to enable capture of a state change at the output of the first storage element during the second operating state.

14. The test system of claim 13, wherein the JTAG compliant integrated circuit comprises a plurality of boundary scan cells, each of the plurality of boundary scan cells comprising one of the first storage element, one of the second storage element connected in series with the respective initialization logic connected between an output of the first storage element and an input of the second storage element and one of the built-in test logic.

15. The test system of claim 14, wherein the JTAG compliant integrated circuit further comprising an interface for controlling the operating state of each of the plurality of boundary scan cells and for evaluating the test completion signal provided by the built-in test logic for at least one of the plurality of boundary scan cells.

16. The test system of claim 15, wherein the interface further comprises a JTAG test access port controller having a plurality of test states, normal activities during at least one of an Update-DR state and a Capture-DR state of the JTAG test access port controller being inhibited during the second operating state to facilitate capture of the state change at the output of the first storage element.

17. The test system of claim 16, wherein the clock shaping system further comprises a delay network that implements an incremental amount of delay on an inverted version of the test clock signal that is logically ORed with the test clock signal to provide the output clock signal with the one of a selectively adjustable rising edge or falling edge during the second operating state.

18. The test system of claim 17, further comprising a counter that provides a counter value that is incremented automatically in response to the test completion signal provided by the built-in test logic for at least one of the plurality of boundary scan cells, the counter value selecting the incremental amount of delay implemented by the delay network.

19. The test system of claim 13, wherein the built in test logic further comprises:
compare logic configured to detect if the output of the first storage element matches a test value; and
selection logic configured to control whether the output signal of the test logic indicates one of a state transition for a rising edge or a state transition for a falling edge.

20. A method for input/output characterization of a JTAG-compliant integrated circuit, the method comprising:
initializing at least a first storage element and a second storage element to a starting value, the first storage element and the second element being connected in series between an input and an output of a boundary scan cell;
inverting an output of the first storage element and providing the inverted output to an input of the second storage element in response to entering a predefined test mode;
feeding back an output of the second storage element to an input of the first storage element;
incrementally adjusting a test clock signal during the predefined test mode; and
detecting at test logic located within the boundary scan cell whether the output of the first storage element and the output of the second storage element are the same; and
providing a test completion signal from the test logic to indicate completion of a respective test for one of a state transition for a rising edge or a state transition for a falling edge.

* * * * *